United States Patent
Kishimoto et al.

(10) Patent No.: US 10,319,801 B2
(45) Date of Patent: Jun. 11, 2019

(54) FLEXIBLE DISPLAY APPARATUS AND METHOD OF MANUFACTURING THE SAME

(71) Applicant: Samsung Display Co., Ltd., Yongin-si, Gyeonggi-do (KR)

(72) Inventors: Hirotsugu Kishimoto, Yongin-si (KR); Youngji Kim, Yongin-si (KR); Hyunggyu Park, Yongin-si (KR); Soohee Oh, Yongin-si (KR); Seonggeun Won, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/676,468

(22) Filed: Aug. 14, 2017

(65) Prior Publication Data

US 2018/0053817 A1 Feb. 22, 2018

(30) Foreign Application Priority Data

Aug. 18, 2016 (KR) .................. 10-2016-0104979

(51) Int. Cl.
*H01L 27/32* (2006.01)
*H01L 51/52* (2006.01)
*H01L 51/00* (2006.01)

(52) U.S. Cl.
CPC ...... *H01L 27/3276* (2013.01); *H01L 51/0097* (2013.01); *H01L 51/5253* (2013.01); *H01L 2251/5338* (2013.01)

(58) Field of Classification Search
CPC ............ H01L 27/3276; H01L 51/0097; H01L 51/5253; H01L 2251/5338

USPC .................................................... 361/679.21
See application file for complete search history.

(56) References Cited

U.S. PATENT DOCUMENTS

| 6,592,783 | B2 | 7/2003 | Kumakura et al. | |
|---|---|---|---|---|
| 2009/0162645 | A1 | 6/2009 | Matsuhira | |
| 2011/0182046 | A1* | 7/2011 | Shiota | H05K 3/323 361/760 |
| 2012/0154707 | A1 | 6/2012 | Hsieh et al. | |
| 2013/0342429 | A1* | 12/2013 | Choi | H05K 13/00 345/30 |
| 2014/0178619 | A1* | 6/2014 | Niiyama | B32B 37/1018 428/40.1 |
| 2014/0183473 | A1* | 7/2014 | Lee | H01L 51/0097 257/40 |

(Continued)

FOREIGN PATENT DOCUMENTS

| JP | 2001-240816 A | 9/2001 |
|---|---|---|
| JP | 2009-25833 A | 2/2009 |
| KR | 10-2008-0001142 A | 1/2008 |

*Primary Examiner* — Rockshana D Chowdhury
(74) *Attorney, Agent, or Firm* — Innovation Counsel LLP

(57) ABSTRACT

Provided is a flexible display apparatus in which flexibility is secured and reliability of products is improved, and a method of manufacturing the same. The flexible display apparatus includes a display panel including a flexible area and a non-flexible area and having one surface and the other surface opposite to the one surface; a protective film attached to the one surface of the display pane; a first adhesive layer interposed between the flexible area of the display panel and the protective film and configured to have a first storage modulus; and a second adhesive layer interposed between the non-flexible area of the display panel and the protective film and configured to have a second storage modulus.

10 Claims, 7 Drawing Sheets

(56) References Cited

U.S. PATENT DOCUMENTS

2014/0295150 A1   10/2014  Bower et al.
2016/0107421 A1*  4/2016  Chung .................. B32B 17/064
                                                  428/41.8
2016/0197300 A1    7/2016  Hwang et al.

* cited by examiner

FLEXIBLE DISPLAY APPARATUS AND METHOD OF MANUFACTURING THE SAME

CROSS-REFERENCE TO RELATED APPLICATION

This application claims the benefit of Korean Patent Application No. 10-2016-0104979, filed on Aug. 18, 2016, in the Korean Intellectual Property Office, the disclosure of which is incorporated herein in its entirety by reference.

BACKGROUND

1. Field

One or more example embodiments relate to a flexible display apparatus and a method of manufacturing the same, and more particularly, to a flexible display apparatus in which flexibility is secured and reliability of products is improved, and a method of manufacturing the same.

2. Description of the Related Art

An organic light-emitting display apparatus has strong points such as a wide viewing angle, excellent contrast and fast response speed, and thus, has received attention as a next-generation display apparatus from among display apparatuses.

In general, the organic light-emitting display apparatus has thin film transistors and organic light-emitting diodes arranged on a substrate and operates as the organic light-emitting diode emits light without a backlight. The organic light-emitting display apparatus is used as a display unit of small products such as a mobile phone and also as a display unit of large products such as a TV.

Recently, the attention on a flexible display apparatus from among organic light-emitting display apparatuses has especially increased and accordingly, research into the flexible display apparatus has actively been performed. A flexible substrate using a material such as synthetic resin, not a conventional glass substrate, is utilized to realize the flexible display apparatus. Since the flexible substrate can easily bend, it is difficult to handle the flexible substrate in a manufacturing process. Accordingly, to resolve this problem, a flexible substrate is formed on a support substrate having sufficient rigidity, and then, a display panel having a display unit which is formed on the flexible substrate is separated from the support substrate.

In the conventional flexible display apparatus and the conventional method of manufacturing the same, a protective film is attached to one surface of a flexible substrate with an adhesive to protect a display panel. Here, when a protective film is attached to a flexible display apparatus by using an adhesive excellent in flexibility, flexibility of the entire flexible display apparatus is improved. However, a mounting rate of a chip on film (COF) is lowered in a region such as a pad unit where flexibility is not required.

SUMMARY

One or more example embodiments include a flexible display apparatus in which flexibility is secured and reliability of a product is improved, and a method of manufacturing the same, while solving various problems including the problem described above. However, such problems are exemplary and the present disclosure is not limited thereto.

Additional aspects will be set forth in part in the description which follows and, in part, will be apparent from the description, or may be learned by practice of the presented example embodiments.

According to one or more example embodiments, a flexible display apparatus includes a display panel including a flexible area and a non-flexible area and having a one surface and another surface opposite to the one surface; a protective film attached to the one surface of the display pane; a first adhesive layer interposed between the flexible area of the display panel and the protective film and having a first storage modulus; and a second adhesive layer interposed between the non-flexible area of the display panel and the protective film and having a second storage modulus.

The first storage modulus may be less than the second storage modulus.

At room temperature, the first storage modulus may be 1 MPa or less and the second storage modulus is 10 MPa or more.

The first adhesive layer and the second adhesive layer may form one layer.

A display unit may be located in the flexible area of the display panel, and a pad unit may be located in the non-flexible area of the display panel.

The protective film may include a first protective film and a second protective film, a first adhesive layer may be interposed between the display panel and the first protective film, and a second adhesive film may be interposed between the display panel and the second protective film layer.

The first and second protective films may be located on a same layer and may be separated from each other.

The first and second adhesive layers may be located on a same layer and may be separated from each other.

The first storage modulus may be less than the second storage modulus.

The second adhesive layer may be formed to have a thickness less than a thickness of the first adhesive layer.

The second adhesive layer may have a thickness of about 15 or less.

According to one or more example embodiments, a method of manufacturing a flexible display apparatus includes preparing a display panel including a flexible area and a non-flexible area and having a one surface and another surface opposite to the one surface; interposing an adhesive between the protective film and the one surface of the display panel, and attaching the protective film to the entire surface of the display panel; and curing the adhesive by irradiating UV light to a portion of the display panel located in the non-flexible area.

The curing the adhesive by irradiating UV light to a portion of the display panel may include forming a first adhesive layer interposed between the flexible area of the display panel and the protective film and having a first storage modulus; and forming a second adhesive layer interposed between the non-flexible area of the display panel and the protective film and having a second storage modulus.

The first storage modulus may be less than the second storage modulus.

A display unit may be formed in the flexible area of the display panel, and a pad unit may be formed in the non-flexible area of the display panel.

These general and specific embodiments may be implemented by using a system, a method, a computer program, or a combination thereof.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
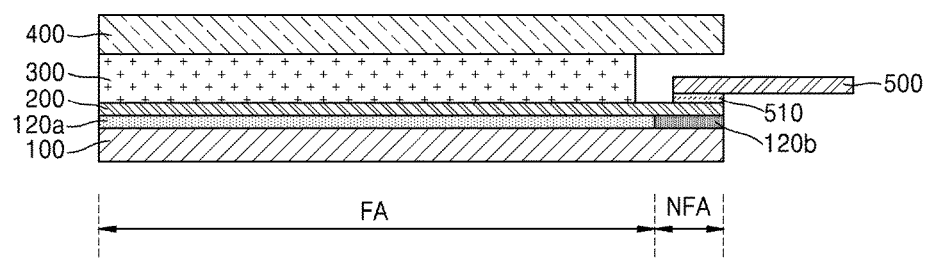
FIG. 1 is a cross-sectional view of a flexible display apparatus according to an example embodiment of the inventive concept.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be understood that the terms such as "include," "comprise," and "have" used herein specify the presence of stated features or components, but do not preclude the presence or addition of one or more other features or components. It will be further understood that when a layer, region, or component is referred to as being "on" another layer, region, or component, it can be directly or indirectly on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items.

FIG. 1 is a cross-sectional view of a flexible display apparatus 10 according to an example embodiment of the inventive concept.

Referring to FIG. 1, the flexible display apparatus 10 according to an example embodiment of the inventive concept includes a display panel 200, a protective film 100 disposed on one surface of the display panel 200, a first adhesive layer 120a interposed between the display panel 200 and the protective film 100, and a second adhesive layer 120b.

The display panel 200 may include a flexible substrate 210 (see FIG. 3) and a display unit that is disposed on the flexible substrate 210 and displays images externally. The display unit may include a plurality of pixels and thin-film transistors TFT. This will be described later below in detail with reference to FIG. 3.

The display panel 200 has a flexible area FA and a non-flexible area NFA. In the present example embodiment, the display unit may be located in the flexible area FA and a pad unit may be located in the non-flexible area NFA. The display panel 200 may have the one surface and the other surface opposite to the one surface, and the protective film 100 may be disposed on the one surface of the display panel 200.

A functional layer 300 may be disposed on the display panel 200. That is, the functional layer 300 may be disposed on the other surface of the display panel 200. Although not shown in FIG. 1, the functional layer 300 may be a composite layer in which a plurality of layers are stacked. The functional layer 300 may include layers such as a polarizing layer 320 (see FIG. 4) and/or a touch screen panel 340 (see FIG. 4), and adhesive layers 310, 330, and 350 (see FIG. 4) interposed between these layers.

A cover window 400 may be disposed on the functional layer 300. The cover window 400 functions to protect the display panel 200 and the functional layer 300 as a whole and may be in close contact with the functional layer 300 without an air gap. The cover window 400 may be made of a transparent material such as a glass or plastic material.

A non-flexible area NFA may be provided on the one surface of the display panel 200, and a pad unit (not shown) may be disposed on the non-flexible area NFA. A flexible printed circuit board 500 may be located on the pad unit. The flexible printed circuit board 500 may be mounted by a method such as a chip on film (COF), a chip on plastic (COP), or the like. The flexible printed circuit board 500 may be electrically connected to the display panel 200 through an anisotropic conductive film (ACF) 510 interposed between the pad unit of the display panel 200 and the flexible printed circuit board 500.

The protective film 100 may be disposed on the one surface of the display panel 200 to protect the display panel 200. Although not shown, the one surface of the display panel 200 may be understood to be the same as one surface of the flexible substrate 210. The protective film 100 may be disposed on the entire surface of the display panel 200. The protective film 100 may be formed of any one material selected from among polyethylene terephthalate (PET), polyethylene naphthalate (PEN), polyethylene sulfide (PES), and polyethylene (PE).

The first and second adhesive layers 120a and 120b may be interposed between the display panel 200 and the protective film 100. The first and second adhesive layers 120a and 120b may function to attach the protective film 100 to the display panel 200. The first and second adhesive layers 120a and 120b may include adhesive materials such as silicone, urethane, acryl, or natural rubber, but are not limited thereto.

The first and second adhesive layers 120a and 120b may be provided as one layer. That is, the first adhesive layer 120a may be interposed between the flexible area FA of the display panel 200 and the protective film 100, and the second adhesive layer 120b may be interposed between the non-flexible area NFA of the display panel 200 and the protective film 100.

Here, the first adhesive layer 120a may have a first storage modulus and the second adhesive layer 120b may have a second storage modulus. In the present example embodiment, the first storage modulus of the first adhesive layer 120a may be less than the second storage modulus of the second adhesive layer 120b. That is, the first adhesive layer 120a may have relatively greater flexibility than the second adhesive layer 120b, and the second adhesive layer 120b may have relatively less flexibility than the first adhesive layer 120a. In the present example embodiment, the first storage modulus of the first adhesive layer 120a may be 1 MPa or less, and preferably 0.1 MPa or less. Also, the second storage modulus of the second adhesive layer 120b may be greater than 1 MPa, and preferably greater than or equal to 10 MPa. The values of the first and second storage modulus may be taken at room temperature.

It is important to secure flexibility in the flexible display apparatus 10. Therefore, it is preferable that the protective film 100 attached to the one surface of the display panel 200 and an adhesive layer for attaching the protective film 100 are also made of a material having excellent flexibility. However, in such a case, in the pad unit in which the flexible printed circuit board 500 or the like is mounted from the outside, the better flexibility of the display panel 200 and the protective film 100 and the adhesive layer disposed therebelow, the lower a mounting rate. That is, in order for the flexible printed circuit board 500 and the like to be stably mounted on the display panel 200, it is required that the pad unit of the display panel 200 that supports the flexible printed circuit board 500 has sufficient rigidity.

Therefore, in the flexible display apparatus 10 according to an example embodiment of the inventive concept, the first adhesive layer 120a disposed under the flexible area FA where the display unit is located of the display panel 200 has the first storage modulus, and the second adhesive layer 120b disposed under the non-flexible area NFA where the pad unit is located has the second storage modulus. That is, the first adhesive layer 120a has relatively greater flexibility than the second adhesive layer 120b, and the second adhesive layer 120b has relatively less flexibility than the first adhesive layer 120a. Therefore, in the flexible display apparatus 10, the flexible area FA where the display unit is located may maintain flexibility, and the pad unit on which the flexible printed circuit board 500 is mounted may have relatively great rigidity.

Figure 2:
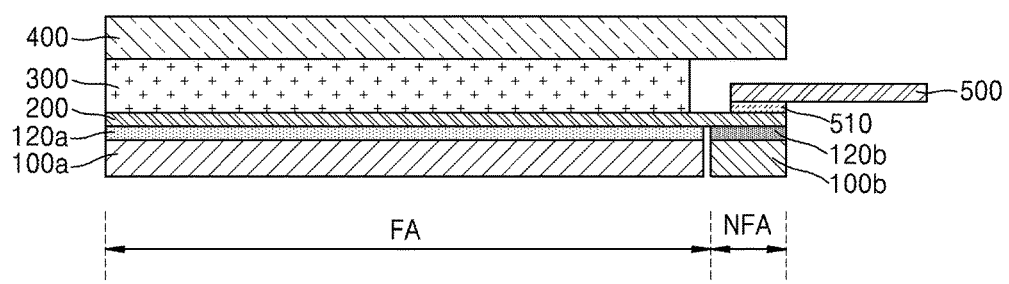
FIG. 2 is a cross-sectional view of a flexible display apparatus according to an example embodiment of the inventive concept.

FIG. 2 is a cross-sectional view of a flexible display apparatus 20 according to an example embodiment of the inventive concept.

Referring to FIG. 2, the flexible display apparatus 20 according to an example embodiment of the inventive concept includes a display panel 200, a first protective film 100a and a second protective film 100b disposed on the one surface of the display panel 200, and the first and second adhesive layers 120a and 120b interposed between the display panel 200 and the first and second protective films 100a and 100b.

The display panel 200 may include a flexible substrate 210 (see FIG. 3) and a display unit that is disposed on the flexible substrate 210 and displays images externally. The display unit may include a plurality of pixels and thin-film transistors TFT.

The display panel 200 has a flexible area FA and a non-flexible area NFA. In the present example embodiment, the display unit may be located in the flexible area FA and a pad unit may be located in the non-flexible area NFA. The display panel 200 may have the one surface and the other surface opposite to the one surface, and the first and second protective films 100a and 100b may be disposed on the one surface of the display panel 200.

The functional layer 300 may be disposed on the display panel 200. That is, the functional layer 300 may be disposed on the other surface of the display panel 200. Although not shown in FIG. 2, the functional layer 300 may be a composite layer in which a plurality of layers are stacked. The functional layer 300 may include layers such as the polarizing layer 320 (see FIG. 4) and/or the touch screen panel 340 (see FIG. 4), and the adhesive layers 310, 330, and 350 (see FIG. 4) interposed between these layers.

The cover window 400 may be disposed on the functional layer 300. The cover window 400 functions to protect the display panel 200 and the functional layer 300 as a whole and may be in close contact with the functional layer 300 without an air gap. The cover window 400 may be made of a transparent material such as a glass or plastic material.

The non-flexible area NFA may be provided on the one surface of the display panel 200, and the pad unit may be disposed on the non-flexible area NFA. The flexible printed circuit board 500 may be located on the pad unit. The flexible printed circuit board 500 may be mounted by a method such as a COF, a COP, or the like. The flexible printed circuit board 500 may be electrically connected to the display panel 200 through the ACF 510 interposed between the pad unit of the display panel 200 and the flexible printed circuit board 500.

The first and second protective films 100a and 100b may be disposed on the one surface of the display panel 200 to protect the display panel 200. Although not shown, the one surface of the display panel 200 may be understood to be the same as the one surface of the flexible substrate 210. The first and second protective films 100a and 100b may be disposed on the entire surface of the display panel 200. The first and second protective films 100a and 100b may be formed of any one material selected from among PET, PEN, PES, and PE.

The first protective film 100a may be disposed in the flexible area FA of the display panel 200 and the second protective film 100b may be disposed in the non-flexible area NFA of the display panel 200. The first and second protective films 100a and 100b may be disposed on an identical layer and may be separated from each other.

The first and second adhesive layers 120a and 120b may be interposed between the display panel 200 and the first and second protective films 100a and 100b. The first and second adhesive layers 120a and 120b may function to attach the first and second protective films 100a and 100b to the display panel 200. The first and second adhesive layers 120a and 120b may include adhesive materials such as silicone, urethane, acryl, or natural rubber, but are not limited thereto.

The first and second adhesive layers 120a and 120b may be disposed on the same layer, e.g. level with each other. That is, the first adhesive layer 120a may be interposed between the flexible area FA of the display panel 200 and the first and second protective films 100a and 100b, and the second adhesive layer 120b may be interposed between the non-flexible area NFA of the display panel 200 and the first and second protective films 100a and 100b. While the first and second adhesive layers 120a and 120b are disposed on the same layer, they may concurrently be spaced apart from each other by a predetermined distance.

In the present example embodiment, the second adhesive layer 120b may be formed to have a thickness less than that of the first adhesive layer 120a. As will be described in detail later below, in the flexible display apparatus 20 according to the present example embodiment, more rigidity is required for the second adhesive layer 120b located in the non-flexible area NFA than the first adhesive layer 120a located in the flexible area FA. Therefore, the second adhesive layer 120b may be pressed to have a thickness that is thinner than that of the first adhesive layer 120a to have more rigidity than the first adhesive layer 120a.

Meanwhile, the first adhesive layer 120a may have the first storage modulus, and the second adhesive layer 120b may have the second storage modulus. In the present example embodiment, the first storage modulus may be less than the second storage modulus. That is, the first adhesive layer 120a may have relatively greater flexibility than the second adhesive layer 120b, and the second adhesive layer 120b may have relatively less flexibility than the first adhesive layer 120a. In the present example embodiment, the first storage modulus of the first adhesive layer 120a may be 1 MPa or less, and preferably 0.1 MPa or less. Also, the second storage modulus of the second adhesive layer 120b may be greater than 1 MPa, and preferably greater than or equal to 10 MPa.

It is important to secure flexibility in the flexible display apparatus 20. Therefore, it is preferable that the first and second protective films 100a and 100b attached to the one surface of the display panel 200 and an adhesive layer for attaching the first and second protective films 100a and 100b are also made of a material having excellent flexibility. However, in such a case, in the pad unit in which the flexible printed circuit board 500 or the like is mounted from the outside, the better flexibility of the display panel 200 and the first and second protective films 100a and 100b and the adhesive layer disposed therebelow, the lower a mounting rate. That is, in order for the flexible printed circuit board 500 and the like to be stably mounted on the display panel 200, it is required that the pad unit of the display panel 200 that supports the flexible printed circuit board 500 has sufficient rigidity.

Therefore, in the flexible display apparatus 20 according to an example embodiment of the inventive concept, the first adhesive layer 120a disposed under the flexible area FA where the display unit is located of the display panel 200 has the first storage modulus, and the second adhesive layer 120b disposed under the non-flexible area NFA where the pad unit is located has the second storage modulus. That is, the first adhesive layer 120a has relatively greater flexibility than the second adhesive layer 120b, and the second adhesive layer 120b has relatively less flexibility than the first adhesive layer 120a. Therefore, in the flexible display apparatus 20, the display unit may maintain flexibility, and the pad unit on which the flexible printed circuit board 500 is mounted may have relatively great rigidity.

Figure 3:
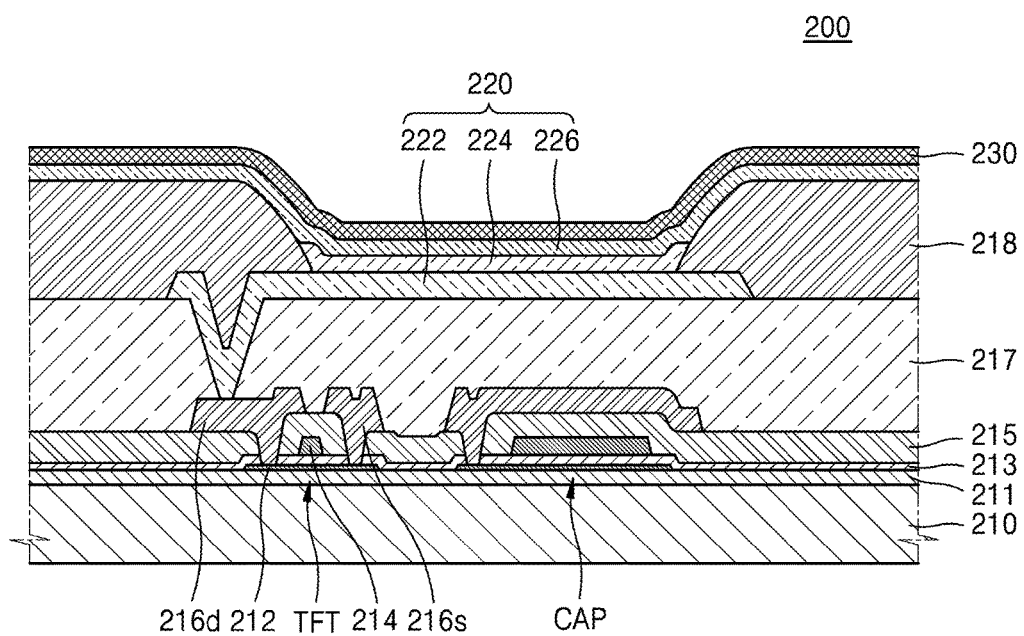
FIG. 3 is a cross-sectional view of a display panel of the flexible display apparatus of FIG. 1.

FIG. 3 is a cross-sectional view of a display panel 200 of the flexible display apparatus 10 of FIG. 1. A structure of FIG. 3 is also the same as that of the display panel 200 of the flexible display apparatus 20 of FIG. 2.

The display panel 200 according to the present example embodiment may include the flexible substrate 210, an organic light-emitting diode 220 disposed on the flexible substrate 210, and an encapsulation layer 230 covering the organic light-emitting diode 220 and disposed on the entire surface of the display panel 200.

The flexible substrate 210 has flexibility and may be formed of various materials such as a metal material having excellent heat resistance and durability or a plastic material such as PET, PEN, and polyimide.

First, in order to planarize the surface of the flexible substrate 210 or to prevent impurities or the like from penetrating into the semiconductor layer 212 of a thin-film transistor TFT, a buffer layer 211 formed of silicon oxide, silicon nitride, or the like is disposed on the flexible substrate 210, and a semiconductor layer 212 may be located on the buffer layer 211.

A gate electrode 214 is disposed on the semiconductor layer 212. A source electrode 216s and a drain electrode 216d are electrically connected to each other according to a signal applied to the gate electrode 214. The gate electrode 214 may be formed of a material such as aluminum (Al), platinum (Pt), palladium (Pd), silver (Ag), gold (Au), nickel (Ni), neodymium (Nd), chromium (Cr), lithium (Li), calcium (Ca), molybdenum (Mo), titanium (Ti), tungsten (W), and copper (Cu) in consideration of adhesion with an adjacent layer, surface flatness of a layer to be stacked, and workability.

Here, a gate insulating layer 213 made of silicon oxide and/or silicon nitride may be formed between the semiconductor layer 212 and the gate electrode 214 in order to ensure insulation between the semiconductor layer 212 and the gate electrode 214.

An interlayer insulating layer 215 may be disposed on the gate electrode 214. The interlayer insulating layer 215 may be formed as a monolayer or a multilayer of a material such as silicon oxide or silicon nitride.

The source electrode 216s and the drain electrode 216d are disposed on the interlayer insulating film 215. The source electrode 216s and the drain electrode 216d are electrically connected to the semiconductor layer 212 through a contact hole formed in the interlayer insulating film 215 and the gate insulating film 213, respectively. The source electrode 216s and the drain electrode 216d may be formed as a monolayer or a multilayer of at least one of Al, Pt, Pd, Ag, Au, Ni, Nd, Cr, Li, Ca, Mo, Ti, W, and copper Cu in consideration of conductivity and the like.

Although not shown in FIG. 3, a protective film (not shown) for covering the thin-film transistor TFT may be disposed to protect the thin-film transistor TFT having such a structure. The protective film may be formed of an inorganic material such as silicon oxide, silicon nitride or silicon oxynitride.

Meanwhile, a planarization layer 217 may be disposed on the flexible substrate 210. In this case, the planarization layer 217 may be a protective film. The planarization layer 217 functions to substantially flatten an upper surface of the thin-film transistor TFT and to protect the thin-film transistor TFT and various devices when the organic light-emitting diode 220 is disposed on the thin-film transistor TFT. The planarization film 217 may be formed of, for example, acrylic organic material or benzocyclobutene (BCB). Here, as shown in FIG. 10, the buffer layer 211, the gate insulating layer 213, the interlayer insulating film 215, and the planarization layer 217 may be formed on the entire surface or substantially the entire surface of the flexible substrate 210.

A pixel defining layer 218 may be disposed above the thin-film transistor TFT. The pixel defining layer 218 may be located on the planarization layer 217 described above and may have an opening. The pixel defining layer 218 serves to define a pixel area on the flexible substrate 210.

The pixel defining layer 218 may be formed of, for example, an organic insulating layer. Examples of such an organic insulating layer may include an acrylic polymer such as polymethylmethacrylate (PMMA), polystyrene (PS), a polymer derivative including a phenol group, an imide polymer, an aryl ether polymer, an amide polymer, a fluorine polymer, a p-xylene polymer, a vinyl alcohol polymer, or a mixture thereof.

The organic light-emitting diode 220 may be disposed on the pixel defining layer 218. The organic light-emitting diode 220 may include a pixel electrode 222, an intermediate layer 224 including an emission layer (EML), and a counter electrode 226.

The pixel electrode 222 may be formed of a semi-transparent electrode or a reflective electrode. When being formed of a semi-transparent electrode, the pixel electrode 222 may include, for example, indium tin oxide (ITO), indium zinc oxide (IZO), zinc oxide (ZnO), indium oxide ($In_2O_3$), indium gallium oxide (IGO), or aluminum zinc oxide (AZO). When being formed of a reflective electrode, the pixel electrode 222 may include, for example, a reflective layer formed of Ag, magnesium (Mg), Al, Pt, Pd, Au, Ni, Nd, iridium (Ir), Cr or a compound thereof, and a layer formed of ITO, IZO, ZnO, $In_2O_3$, IGO or AZO. However, the inventive concept is not limited thereto and various modifications are possible. The pixel electrode 222 may be formed of various materials, and may have a monolayer or a multilayer structure.

The intermediate layer 224 may be disposed in the pixel area defined by the pixel defining layer 218. The intermediate layer 224 includes the EML that emits light by an electrical signal. In the intermediate layer 224, as well as the EML, a hole injection layer (HIL) disposed between the EML and the pixel electrode 222, a hole transport layer (HTL), an electron transport layer (ETL) disposed between the EML and the counter electrode 226, an electron injection layer (EIL) or the like may be stacked in a single or composite structure. However, the intermediate layer 224 is not limited thereto, and may have various structures.

The counter electrode 226 covering the intermediate layer 224 including the EML and facing the pixel electrode 222 may be disposed over the entire surface of the flexible substrate 210. The counter electrode 226 may be formed of a semi-transparent electrode or a reflective electrode.

When being formed of a semi-transparent electrode, the counter electrode 226 may include a layer formed of a metal having a small work function, for example, Li, Ca, lithium fluoride (LiF)/Ca, LiF/Al, Al, Ag, Mg, or a compound thereof, and a semi-transparent conductive layer such as ITO, IZO, ZnO, or $In_2O_3$. When being formed of a reflective electrode, the counter electrode 226 may include a layer formed of Li, Ca, LiF/Ca, LiF/Al, Al, Ag, Mg, or a compound thereof. However, structures and materials of the counter electrode 226 are not limited thereto and may vary.

The encapsulation layer 230 may be disposed on the counter electrode 226. Although not shown in FIG. 3, the sealing layer 230 may be a multilayer structure in which one or more inorganic films (not shown) and organic films (not shown) are stacked. When the sealing layer 230 is formed of only organic films or inorganic films, oxygen, moisture, or the like may penetrate through a fine passage formed inside the films, and a display unit may be damaged.

Figure 4:
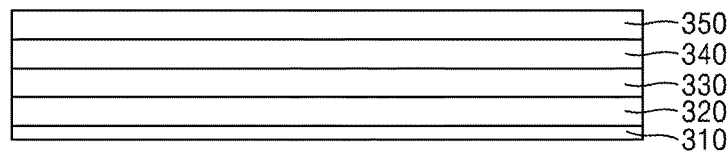
FIG. 4 is a cross-sectional view of a functional layer of the flexible display apparatus of FIG. 1.

FIG. 4 is a cross-sectional view of a functional layer 300 of the flexible display apparatus of FIG. 1.

Referring to FIG. 4, the functional layer 300 may include a polarizing layer 320 and a touch screen panel 340. Although not shown, a capping layer or the like may be further included in some cases. An adhesive layer 330 may be disposed between the polarizing layer 320 and the touch screen panel 340.

The functional layer 300 may be disposed between the display panel 200 and the cover window 400 as shown in FIG. 1. Therefore, an adhesive layer 310 may be interposed between the display panel 200 and the polarizing layer 320 and an adhesive layer 350 may be interposed between the cover window 400 and the touch screen panel 340. However, other layers may also be further interposed between the layers described above.

The adhesive layers 310, 330, and 350 may be formed of a transparent adhesive material such as an optically clear adhesive (OCA) or an optically clear resin (OCR) so that the entire surface of the flexible display apparatus 10 of the present example embodiment can easily emit light.

The functional layer 300 may be disposed on the display panel 200. That is, the functional layer 300 may be disposed on the other surface of the display panel 200. Although not shown in FIG. 2, the functional layer 300 may be a composite layer in which a plurality of layers are stacked. The functional layer 300 may include layers such as the polarizing layer 320 (see FIG. 4) and/or the touch screen panel 340 (see FIG. 4), and the adhesive layers 310, 330, and 350 (see FIG. 4) interposed between these layers.

Although only a flexible display apparatus has been described so far, the inventive concept is not limited thereto. For example, a method of manufacturing a flexible display apparatus for manufacturing such a flexible display apparatus is also within the scopes of the inventive concept.

Figure 5:
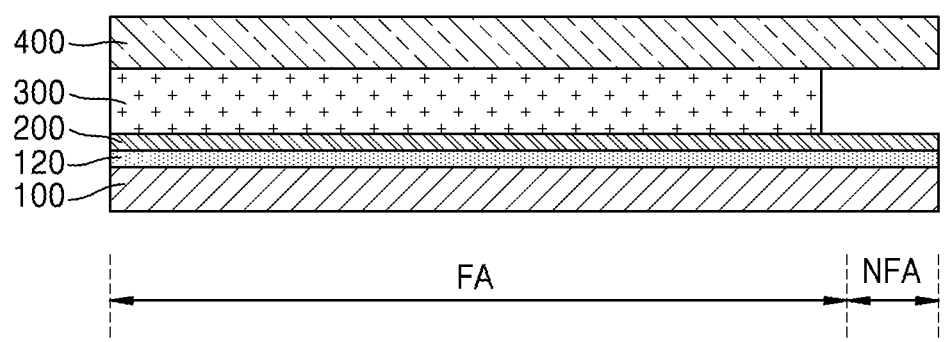
FIGS. 5, 6 and 7 are sectional views illustrating a manufacturing process of the flexible display apparatus of FIG. 1.
Figure 6:
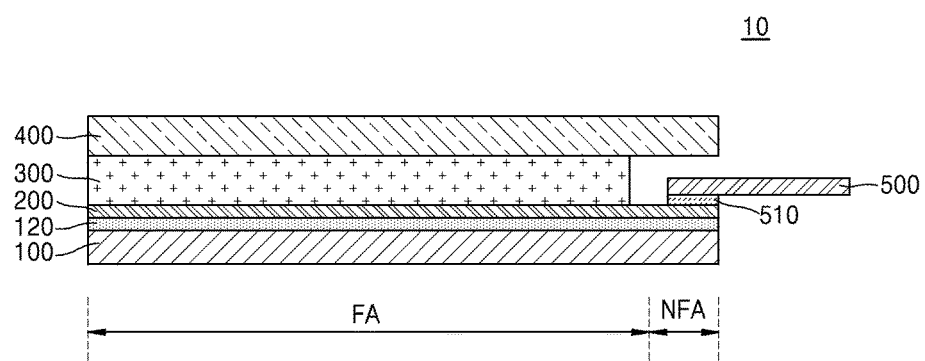
Figure 7:
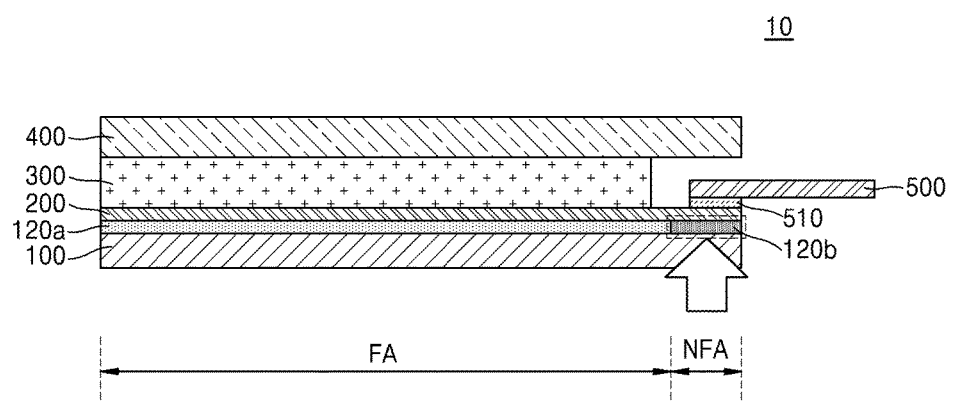

FIGS. 5 through 7 are sectional views illustrating a manufacturing process of the flexible display apparatus 10 of FIG. 1.

Referring to FIG. 5, the manufacturing process of the flexible display apparatus 10 may be performed by preparing the display panel 200 including the flexible area FA and the non-flexible area NFA and having the one surface and the other surface opposite to the one surface. A display unit (not shown) may be formed in the flexible area FA of the display panel 200 and a pad unit (not shown) may be formed in the non-flexible area NFA.

Referring to a structure of FIG. 3, the display panel 200 may include the flexible substrate 210 on which the thin-film transistor TFT, a capacitor CAP, or the like are formed, and the organic light-emitting diode 220 electrically connected to the thin-film transistor TFT. The encapsulation layer 230 may be formed on the organic light-emitting diode 220 by alternately forming an organic layer and an inorganic layer.

The display panel 200 may be manufactured by forming the flexible substrate 210 on a supporting substrate (not shown) and then forming various devices thereon since the display panel 200 has flexibility. After the display panel 200 is manufactured, the display panel 200 is separated from the supporting substrate.

The display panel 200 separated from the supporting substrate may be attached with the protective film 100 at a lower part of the display panel 200 for a subsequent process. The protective film 100 may be attached to the display panel 200 through an adhesive 120 located between the protective film 100 and the one surface of the display panel 200. The protective film 100 is attached to the entire surface of the display panel 200 to protect the flexible substrate 210 of the display panel 200 and to prevent impurities from entering the display panel 200. The protective film 100 may be formed of any one material selected from among PET, PEN, PES, and PE.

The functional layer 300 may be disposed on the display panel 200. That is, the functional layer 300 may be disposed on the other surface of the display panel 200. Referring to FIG. 4, the functional layer 300 may be a composite layer in which a plurality of layers are stacked. The functional layer 300 may be formed by stacking layers such as the polarizing layer 320 and the touch screen panel 340, and the polarizing layer 320 and the touch screen panel 340 may be adhered to each other through the adhesive layers 310, 330, and 350. The adhesive layers 310, 330, and 350 may be formed of a transparent adhesive material such as an OCA or an OCR so that the entire surface of the flexible display apparatus 10 of the present example embodiment can easily emit light.

The cover window 400 may be disposed on the functional layer 300. The cover window 400 functions to protect the display panel 200 and the functional layer 300 as a whole and may be in close contact with the functional layer 300 without an air gap. The cover window 400 may be made of a transparent material such as a glass or plastic material.

Referring to FIG. 6, a pad unit may be formed in the non-flexible area NFA located at the one surface of the display panel 200. The flexible printed circuit board 500 may be mounted on the pad unit. The flexible printed circuit board 500 may be mounted by a method such as a COF, a COP, or the like. The flexible printed circuit board 500 may electrically connect the pad unit of the display panel 200 and the flexible printed circuit board 500 through the ACF 510.

Referring to FIG. 7, the adhesive 120 between the display panel 200 and the protective film 100 may be cured by irradiating UV light to a portion of the display panel 200 located in the non-flexible area NFA. The UV irradiation and curing may be performed at any time after attaching the protective film 100 to the display panel 200. That is, the UV irradiation and curing may be directly performed after the protective film 100 is attached to the display panel 200, may be performed after forming the functional layers 300 and the cover window 400 on the display panel 200, or may be performed after the flexible printed circuit board 500 is mounted on the one surface of the display panel 200.

Through this process, it will be understood that the portion of the display panel 200 located in the flexible area FA is located on the first adhesive layer 120a and the portion of the display panel 200 located in the non-flexible area NFA is located on the second adhesive layer 120b. The first and second adhesive layers 120a and 120b may include adhesive materials such as silicone, urethane, acryl, or natural rubber, but are not limited thereto.

The first and second adhesive layers 120a and 120b will be understood as one layer formed by separating the adhesive 120 through the UV irradiation process as described above. That is, the first adhesive layer 120a may be interposed between the flexible area FA of the display panel 200 and the protective film 100, and the second adhesive layer 120b may be interposed between the non-flexible area NFA of the display panel 200 and the protective film 100.

The first adhesive layer 120a may have the first storage modulus, and the second adhesive layer 120b may have the second storage modulus. In the present example embodiment, the first storage modulus of the first adhesive layer 120a may be less than the second storage modulus of the second adhesive layer 120b. That is, the first adhesive layer 120a may have relatively greater flexibility than the second adhesive layer 120b, and the second adhesive layer 120b may have relatively less flexibility than the first adhesive layer 120a. In the present example embodiment, the first storage modulus of the first adhesive layer 120a may be 1 MPa or less, and preferably 0.1 MPa or less. Also, the second storage modulus of the second adhesive layer 120b may be greater than 1 MPa, and preferably greater than or equal to 10 MPa.

It is important to secure flexibility in the flexible display apparatus 10. Therefore, it is preferable that the protective film 100 attached to the one surface of the display panel 200 and an adhesive layer for attaching the protective film 100 are also made of a material having excellent flexibility. However, in such a case, in the pad unit in which the flexible printed circuit board 500 or the like is mounted from the outside, the better flexibility of the display panel 200 and the protective film 100 and the adhesive layer disposed therebelow, the lower a mounting rate. That is, in order for the flexible printed circuit board 500 and the like to be stably mounted on the display panel 200, it is required that the pad unit of the display panel 200 that supports the flexible printed circuit board 500 has sufficient rigidity.

Therefore, in the flexible display apparatus 10 according to an example embodiment of the inventive concept, the first adhesive layer 120a disposed under the flexible area FA where the display unit is located of the display panel 200 has the first storage modulus, and the second adhesive layer 120b disposed under the non-flexible area NFA where the pad unit is located has the second storage modulus. That is, the first adhesive layer 120a has relatively greater flexibility than the second adhesive layer 120b, and the second adhesive layer 120b has relatively less flexibility than the first adhesive layer 120a. Therefore, in the flexible display apparatus 10, the flexible area FA where the display unit is located may maintain flexibility, and the pad unit on which the flexible printed circuit board 500 is mounted may have relatively great rigidity.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
   a display panel including a flexible area and a non-flexible area and having a one surface and another surface opposite to the one surface;
   a protective film attached to the one surface of the display panel;
   a first adhesive layer interposed between the flexible area of the display panel and the protective film and having a first storage modulus; and
   a second adhesive layer interposed between the non-flexible area of the display panel and the protective film and having a second storage modulus,
   wherein the display panel includes a display unit and a pad unit,
   wherein the display unit is located in the flexible area of the display panel, and the pad unit is located in the non-flexible area of the display panel,
   wherein the display unit has flexibility in all regions;
   wherein the first adhesive layer is in contact with the flexible area of the display unit and the protective film.

2. The flexible display apparatus of claim 1, wherein the first storage modulus is less than the second storage modulus.

3. The flexible display apparatus of claim 2, wherein at room temperature, the first storage modulus is 1 MPa or less and the second storage modulus is 10 MPa or more.

4. The flexible display apparatus of claim 1, wherein the first adhesive layer and the second adhesive layer form one layer.

5. The flexible display apparatus of claim 1, wherein the protective film comprises a first protective film and a second protective film, a first adhesive layer is interposed between the display panel and the first protective film, and a second adhesive film is interposed between the display panel and the second protective film layer.

6. The flexible display apparatus of claim 5, wherein the first and second protective films are located on a same layer and are separated from each other.

7. The flexible display apparatus of claim 5, wherein the first and second adhesive layers are located on a same layer and are separated from each other.

8. The flexible display apparatus of claim 5, wherein the first storage modulus is less than the second storage modulus.

9. The flexible display apparatus of claim 5, wherein the second adhesive layer is formed to have a thickness less than a thickness of the first adhesive layer.

10. The flexible display apparatus of claim 9, wherein the second adhesive layer has a thickness of about 15 μm or less.

* * * * *